(12) United States Patent
Rao et al.

(10) Patent No.: US 12,230,346 B2
(45) Date of Patent: Feb. 18, 2025

(54) CROSS-POINT MEMORY READ TECHNIQUE TO MITIGATE DRIFT ERRORS

(71) Applicant: Intel Corporation, Santa Clara, CA (US)

(72) Inventors: Hemant P. Rao, Albuquerque, NM (US); Raymond W. Zeng, Sunnyvale, CA (US); Prashant S. Damle, Portland, OR (US); Zion S. Kwok, Burnaby (CA); Kiran Pangal, Fremont, CA (US); Mase J. Taub, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 726 days.

(21) Appl. No.: 17/358,421

(22) Filed: Jun. 25, 2021

(65) Prior Publication Data

US 2022/0415425 A1    Dec. 29, 2022

(51) Int. Cl.
*G11C 29/00*  (2006.01)
*G11C 7/06*  (2006.01)
(Continued)

(52) U.S. Cl.
CPC ............... *G11C 29/42* (2013.01); *G11C 7/06* (2013.01); *G11C 29/12005* (2013.01); *G11C 29/4401* (2013.01); *G11C 29/50004* (2013.01)

(58) Field of Classification Search
CPC .............. G11C 13/003; G11C 13/0004; G11C 13/0069; G11C 2213/77; G11C 13/004; G11C 2213/15; G11C 2213/76; G11C 13/0097; G11C 2213/71; G11C 11/5628; G11C 11/5678; G11C 16/0483; G11C 16/3459; G11C 2013/0045; G11C 2013/0078; G11C 2013/0092; G11C 2213/30; G11C 29/50004; G11C 11/5642; G11C 13/0026; G11C 13/0028; G11C 13/0033; G11C 13/0035; G11C 13/0061; G11C 16/26; G11C 2013/0057; G11C 2013/0076; G11C 2213/73; G11C 29/12005; G11C 29/42; G11C 29/4401; G11C 7/06; G11C 11/5671; G11C 16/10; G11C 16/3404; G11C 16/3481; G11C 2029/0411; G11C 29/52; G11C 11/161; G11C 11/1659; G11C 11/1673; G11C 11/1675; G11C 11/1695; G11C 13/0038;
(Continued)

(56) References Cited

U.S. PATENT DOCUMENTS 11,972,787 B2 *   4/2024  Tran ................... G11C 11/1659
2016/0284399 A1    9/2016  Mantegazza et al.

OTHER PUBLICATIONS

Extended European Search Report for Patent Application No. 22164178.0, Mailed Sep. 9, 2022, 8 pages.

* cited by examiner

*Primary Examiner* — Thong Q Le
(74) *Attorney, Agent, or Firm* — Akona IP PC

(57) ABSTRACT

A read technique for both SLC (single level cell) and MLC (multi-level cell) cross-point memory can mitigate drift-related errors with minimal or no drift tracking. In one example, a read at a higher magnitude voltage is applied first, which causes the drift for cells in a lower threshold voltage state to be reset. In one example, the read at the first voltage can be a full float read to minimize disturb. A second read can then be performed at a lower voltage without the need to adjust the read voltage due to drift.

20 Claims, 10 Drawing Sheets

(51) Int. Cl.
*G11C 29/12* (2006.01)
*G11C 29/42* (2006.01)
*G11C 29/44* (2006.01)
*G11C 29/50* (2006.01)

(58) Field of Classification Search
CPC ....... G11C 16/08; G11C 16/102; G11C 16/24; G11C 16/32; G11C 16/3418; G11C 16/3427; G11C 5/147; G11C 7/20; G11C 16/105; G11C 16/28; G11C 16/3454; G11C 16/3486; G11C 2029/0409; G11C 2029/5004; G11C 29/028; G11C 5/025
See application file for complete search history.

CROSS-POINT MEMORY READ TECHNIQUE TO MITIGATE DRIFT ERRORS

FIELD

The descriptions are generally related to memory, and more particularly, to techniques for reading cross-point memory.

BACKGROUND

Memory resources have innumerable applications in electronic devices and other computing environments. There is demand for memory technologies that can scale smaller than traditional memory devices. However, continued drive to smaller and more energy efficient devices has resulted in scaling issues with traditional memory devices. Three-dimensional memory devices emerged as a solution to the scaling limitations of traditional memory devices.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing at least one implementation of the invention that includes one or more particular features, structures, or characteristics. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein.

DETAILED DESCRIPTION

Techniques for reading cross-point memory that can mitigate errors due to threshold voltage drift are described herein.

Cross-point memory technologies are susceptible to threshold voltage drift. Threshold voltage drift refers to the change (e.g., increase) of a cell's threshold voltage over time. One technique for mitigating threshold voltage drift in SLC (single level cells) cross-point memory is drift tracking. Drift tracking involves tracking the time elapsed since the last write to a memory cell. A write operation "resets the drift" of a cell so that the threshold voltage of the memory cell shifts back to the pre-drift level. By tracking the time since the last write, the expected amount of drift can be determined, and an appropriate read voltage can be used to perform a read operation.

A similar technique can be used with MLC (multi-level cells) memory. An MLC cross-point memory includes cells that can store more than one bit (e.g., 1.5 bits, 2 bits, or more). For example, a 2-bit memory cell is programmable to one of four states. A 1.5-bit memory cell is programmable to one of three states. One aspect in which MLC differs from SLC is that a read operation in MLC memory can reset the drift of a cell similar to how a write resets the drift. For example, a read at a voltage between the threshold voltage distributions of the two lowest or two highest Vt states can cause the drift of cells in a lower Vt state to reset. Therefore, in MLC cross-point memory, drift tracking may involve tracking the time since last read in addition to the time since last write.

In contrast, a technique for reading cross-point memory that causes drift to be reset involves minimal or no drift tracking. In one example, an MLC read is first performed on the two highest Vt states. This first MLC read will reset the drift of the two lowest Vt states and thus eliminate the need for read drift tracking of the 2 lowest Vt states. In one example, the first read can be a "full float read." A full float read involves first floating the bitline or wordline, and then ramping up the bitline or wordline that is not floated (e.g., the driven bitline or wordline) to a higher voltage for a short duration. Then, a read at a lower voltage is performed without the need to consider time since the cell was last accessed.

Figure 1:
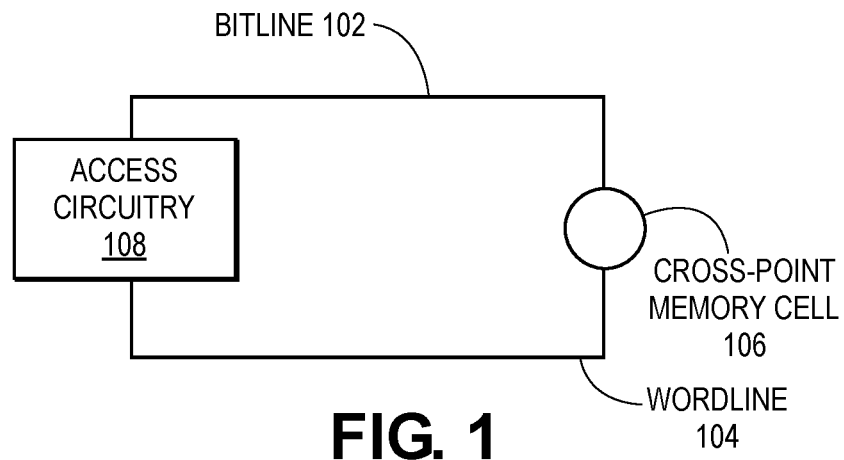
FIG. 1 is circuit diagram of an example of a two-terminal cross-point memory cell that can be read using techniques described herein.

FIG. 1 is circuit diagram of an example of a two-terminal cross-point memory cell that can be read using techniques described herein. The cross-point memory cell is one of many memory cells in a cross-point memory device. The cross-point memory cell 106 is coupled with access circuitry 108 via a bitline 102 and a wordline 104. The cross-point memory cell 106 includes one or more materials to store one or more bits. The cross-point memory cell 106 can include a memory element and a switch element. The memory element can store information by being placed in one of multiple states (e.g., resistive or resistance states). The memory element of the cross-point memory cell 106 can include any memory element with a tunable threshold voltage. The switch element enables selection of the memory cell, and thus may also be referred to as a select device. In one example, the switch element can also be placed in one of multiple states (e.g., resistive or resistance states). In one example, the memory element and switch element can be independently placed in different resistive states to enable the memory cell to store more than 1 bit.

In one example, each resistive state of the memory element and the switch element is associated with a different threshold voltage (Vt). A threshold voltage is a voltage at which the element (e.g., memory element or switch element) undergoes a change (e.g., a physical change) that causes the cell to be in a higher conductive state. The threshold voltage of the memory cell is based on the threshold voltage of both the memory element and the switch element. In one example, a memory cell can be said to "threshold" or undergo a "threshold event." In one example, when a memory cell thresholds (e.g., in response to an applied voltage with a magnitude greater than the threshold voltage at the current state), the switch element, memory element, or both, undergo a physical change that causes the memory cell to exhibit a certain electrical characteristics, such as high conductivity. Once a cell thresholds, a program current of a particular amplitude, polarity, and duration can be applied to the cell to cause the cell to be in the desired resistive state. The value stored by the cross-point memory cell 106 can therefore be determined by detecting the resistive state of the cell, which can be determined by detecting the current that flows through the cell in response to one or more applied voltages.

The memory cell 106 is coupled with circuitry 108 to enable access to and operation of the memory cell 106. The circuitry includes electronic components that are electrically coupled to perform one or more of: supplying voltages to the memory cell, sensing electrical responses of the memory cell, performing analog or logic operations on received or stored information, outputting information, and storing information. In one example, the access circuitry 108 includes circuitry to select memory cells, write to memory cells, and read from memory cells. In one example, circuitry to select memory cells includes select transistors (e.g., local and global wordline and bitline select transistors). In one example, the sensing circuitry includes a sense amplifier (sense amp).

As mentioned above, in one example, both the memory element and the switch element can be placed independently in different resistance states to write a multi-bit value to the memory cell. For example, the circuitry 108 can independently set a state of the memory element and a state of the switch element of a cross-point memory cell of the array to program the cross-point memory cell to one of multiple logic values, including a low magnitude threshold voltage, a second logic value corresponding to a high magnitude threshold voltage, and at least a third logic value corresponding to an intermediate threshold voltage.

Figure 2A:
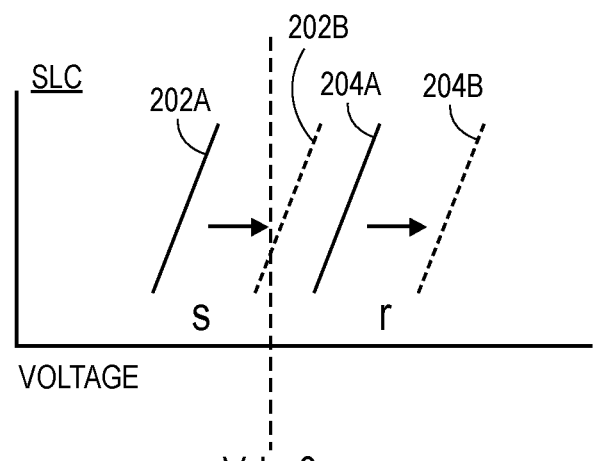
FIG. 2A is a graph illustrating an example of drift in an SLC memory cell.
Figure 2B:
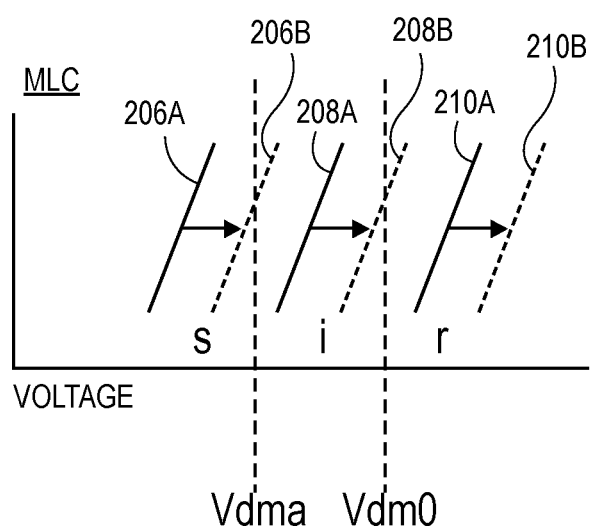
FIG. 2B is a graph illustrating an example of drift in an MLC memory cell.

As mentioned above, cross-point memory may experience threshold voltage drift over time. FIGS. 2A and 2B are graphs illustrating drift in an SLC memory cell and an MLC memory cell, respectively. In the graphs of FIGS. 2A and 2B, the x-axis represents voltage, and the y-axis represents cumulative probability.

Turning to the SLC example of FIG. 2A, the line 202A represents a range of threshold voltages for memory cells in a "set" state before drift. The line 204A represents a range of threshold voltages for memory cells in a "reset" state before drift. In this example, the "set" state refers to a state with lower threshold voltage (e.g., a lower resistance state) and the "reset" state refers to a state with a higher threshold voltage (e.g., a higher resistance state).

When there is no drift, a demarcation voltage (Vdm) between the set and reset threshold voltages can be used to read a memory cell. However, over time, the threshold voltage of a memory cell may increase to the point where a read with the demarcation voltage can no longer accurately determine the state of the cell. For example, the line 202B represents a range of threshold voltages for a memory cell in the set state after drift has occurred. Similarly, the line 204B represents a range of threshold voltages for a memory cell in the reset state after drift has occurred. As can be seen in the example in FIG. 2A, the original Vdm0 is no longer between the threshold voltages of the set and reset states, but instead is lower than the threshold voltage of most cells in the set state. Therefore, using Vdm0 to read memory cells that have experienced drift may result in erroneous results.

FIG. 2B is a graph illustrating drift in a 1.5 bit MLC memory cell. In this example, there are three memory states including set, intermediate, and reset. In one example, the different states may be achieved by putting the select device and storage material in different resistance states. In one example, the set state may be defined as a state in which both the storage material and the select device are in a low Vt state. In one such example where the storage material is a phase change material, the phase change material may be in a crystalline state. In one example, the intermediate state may be defined as a state in which the storage material is in a high Vt state and the select device is in a low Vt state or in which the storage material is in a low Vt state and the select device is in a high Vt state. In one example in which the storage material is a phase change material, the phase change material is in a high Vt state when it is in an amorphous state. Intermediate state may also be achieved with intermediate Vt states of the storage material and/or select device, such as by placing the storage material in a partially crystalline or partially amorphous state. In one example, a reset state may be defined as a state in which both the storage material and the select device are in a high Vt state. Some of the following examples refer to the states as "set," "intermediate," and "reset" for ease of reference. However, the techniques described are not limited to MLC memory with three memory states.

In the example of FIG. 2B, the line 206A represents a threshold voltage range for memory cells in the set state without drift. The line 208A represents a threshold voltage range for memory cells in an intermediate state without drift. The line 210A represents a threshold voltage range for memory cells in a reset state without drift. Without drift, demarcation voltages Vdma and Vdm0 can be used to read the state of a memory cell. However, MLC memory cells experiencing drift may not be accurately read with Vdma and Vdm0. The lines 206B, 208B, and 210B show the threshold voltage ranges after drift. Like in the SLC case, Vdma and Vdm0 are no longer between the intended threshold voltages and using those voltages to read may result in errors.

Figure 2C:
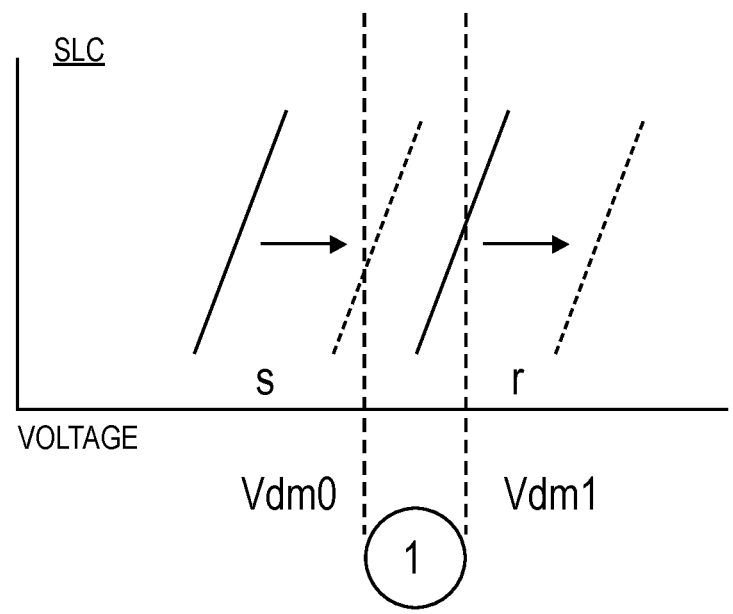
FIG. 2C illustrates an example of read voltages in a memory device with drift tracking for SLC memory.
Figure 2D:
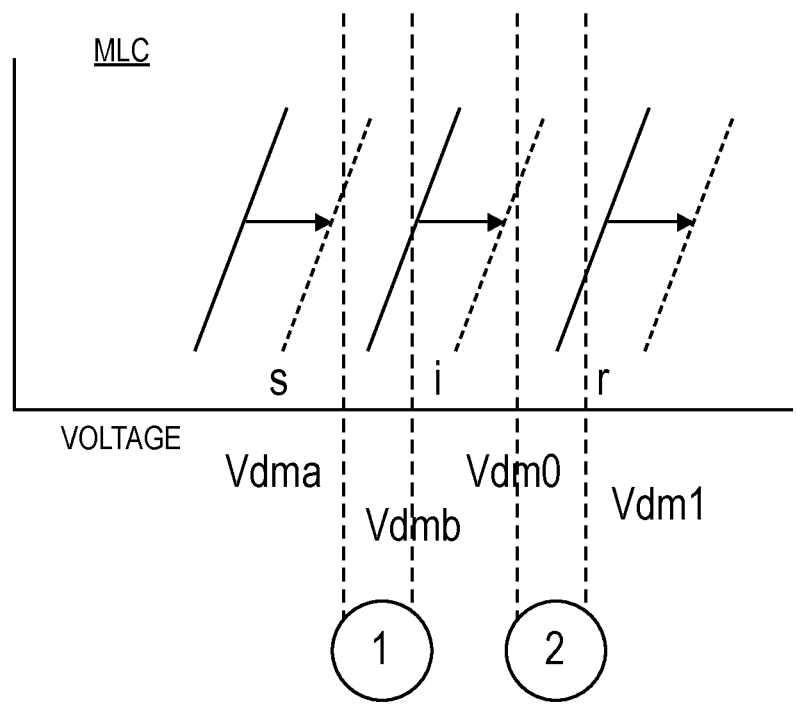
FIG. 2D illustrates an example of read voltages in a memory device with drift tracking for MLC memory.

As mentioned above, drift tracking is one technique to account for drift and mitigate drift errors. FIGS. 2C and 2D illustrate examples of read voltages in a memory device with drift tracking for SLC and MLC memory, respectively. Drift is a function of time. Therefore, a certain amount of drift can be expected after a particular time has elapsed. As mentioned above, a write to a memory cell resets the drift. Therefore, drift tracking typically involves tracking the time since the last write in order to determine what voltage to use to perform a read operation.

The example of FIG. 2C shows threshold voltages after drift for SLC memory. If there is zero expected drift (e.g., due to a recent write to the memory cell), then the voltage Vdm0 is used to perform the read operation. In one example, if some time has passed since the last write so that there is expected drift, then a higher voltage is used to read the memory cell (e.g., a voltage>Vdm0 and <=Vdm1). In one such example, performing a read operation of an SLC memory cell with drift tracking involves determining the time since last write, selecting a read voltage based on the time since the last write, and applying the selected read voltage. Because the read voltage is adjusted to account for drift, the read voltage is between the drifted threshold voltage distributions for memory cells in the set and reset states.

The example of FIG. 2D shows threshold voltages after drift for MLC memory with three states. In one example, in order to track drift for MLC memory, both the time since last write and the time since last read are tracked. For example, the time since last read in which a higher read voltage was applied (e.g., a voltage between the intermediate and reset voltage distributions) is tracked due to its drift-resetting effect on memory cells in the set and intermediate states. In one such example, if there is zero expected drift (e.g., due to a recent read or write to the memory cell), then the voltages Vdma and Vdm0 are used to perform the read operation. In one example, if some time has passed since the last write or read so that there is expected drift, then higher voltages are used to read the memory cell (e.g., a voltage>Vdma and <=Vdmb and a voltage>Vdm0 and <=Vdm1). In one such example, performing a read operation of an MLC memory cell with drift tracking involves determining the time since last read or write, selecting read voltages based on the time since the last read or write, applying the lower selected read voltage (e.g., a voltage between Vdma and Vdmb), sensing the response of the cell to the applied voltage, and then applying the higher selected read voltage (e.g., a voltage between Vdm0 and Vdm1). The lower read voltage adjusted for drift is between the expected threshold voltage distributions of memory cells in the set and intermediate state. The higher read voltage adjusted for drift is between the expected threshold voltage distributions of the intermediate and reset states.

Thus, read schemes for 1.5 bit cross-point memory typically rely on using two reads for first demarcating the set and intermediate state with a lower Vdm and then twiddling out these bits for the next read to demarcate the intermediate and reset states with a higher Vdm. Reading both the set and intermediate state typically re-initializes the drift clock. Therefore, such a read technique involves either tracking the time since the last read in addition to the time since the last write, or a very high read window budget to absorb drift related shifts in threshold voltage. Although drift tracking can be an effective way to mitigate drift-related errors, tracking time since the last read in addition to tracking the time since the last write adds additional circuitry and cost. In contrast, a read technique that involves a read at a higher magnitude voltage followed by one or more reads at a lower magnitude voltage mitigates drift without the need to track the time since the last read or write.

Figure 3A:
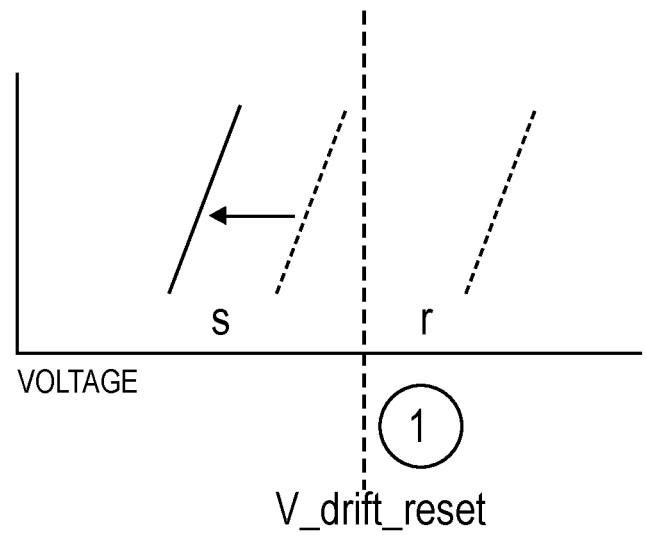
FIGS. 3A and 3B illustrate an example of read at a higher voltage followed by a read at a lower voltage for SLC memory.
Figure 3B:
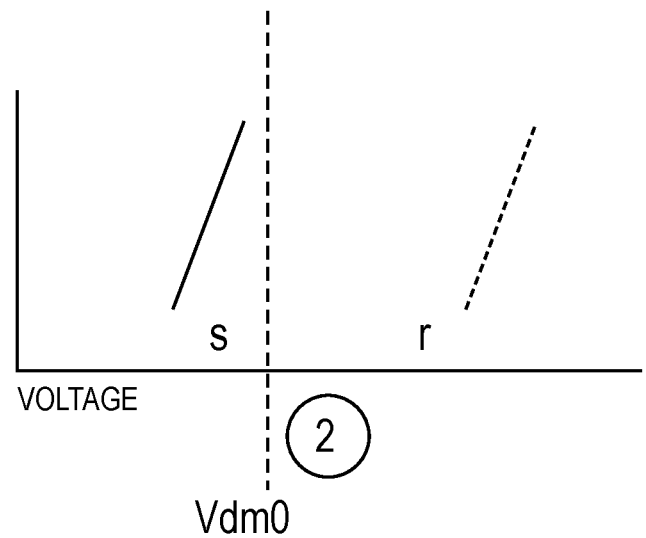

FIGS. 3A and 3B illustrate an example of a read at a higher voltage followed by a read at a lower voltage for SLC memory. Referring to FIG. 3A, a first read (labeled "1") is performed at a higher magnitude voltage (e.g., V_drift_reset). The first read is performed at a voltage level that causes the drift for memory cells in the set state to reset. In one such example, the first read is performed at a voltage that has a higher magnitude than the expected set threshold voltage. Drift may or may not be considered in selecting the voltage to perform the first read at for SLC memory, as long as the voltage causes the drift to reset for the lower threshold voltage state. In one example, the first read is performed at a voltage that is adjusted to account for drift (e.g., based on the time elapsed since the last write operation to the memory cell).

In another example, the first read is performed at a voltage that has a larger magnitude than the highest expected set threshold voltage after drift. By applying a voltage that has a magnitude that is larger than the highest expected set threshold voltage after drift, the drift for set cells can be reset without tracking drift (e.g., without tracking the time since the last write to the memory cell). The first read in SLC memory can be performed at a voltage with a lower or higher magnitude than the reset threshold voltage. In one example, the first read is performed at a voltage that has a magnitude lower than the reset threshold voltage (e.g., |expected set Vt|<|V_drift_reset|<|expected reset Vt|). In another example, the first read is performed at a voltage that has a magnitude greater to or equal to the reset threshold voltage (e.g., |V_drift_reset|>|expected reset Vt|). In one such example, drift for reset cells is also reset.

Referring to FIG. 3B, after the first read at the higher magnitude voltage, a read at a lower voltage (e.g., Vdm0) (labeled "2") is performed. Because the first read causes drift to be reset for cells in the set state, a pre-drift read voltage can be used. Thus, by first performing a read at a higher magnitude, the drift of set cells is reset, enabling the read operation to be performed at the lower pre-drift read voltage and eliminating the need to track drift for SLC memory.

Figure 4A:
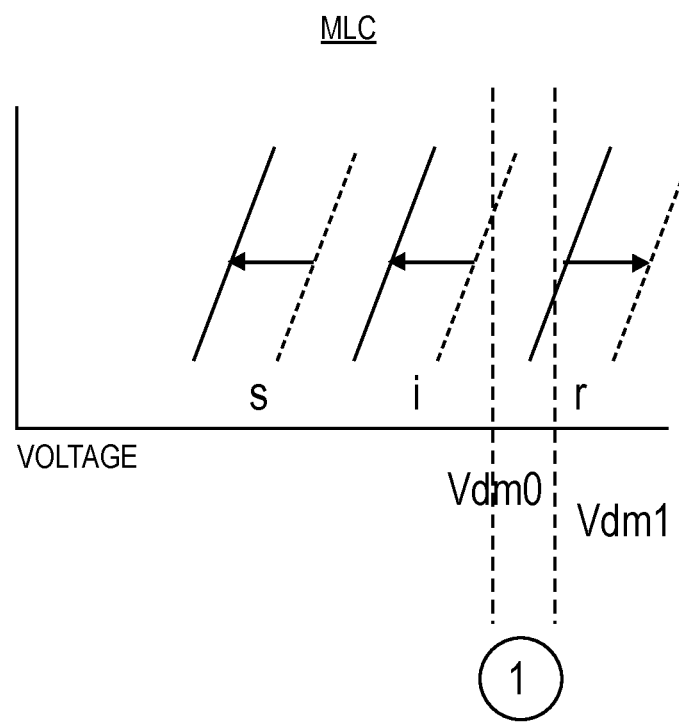
FIGS. 4A and 4B illustrate an example of a read at a higher magnitude voltage followed by a read at a lower magnitude voltage for 1.5 bit MLC memory.
Figure 4B:
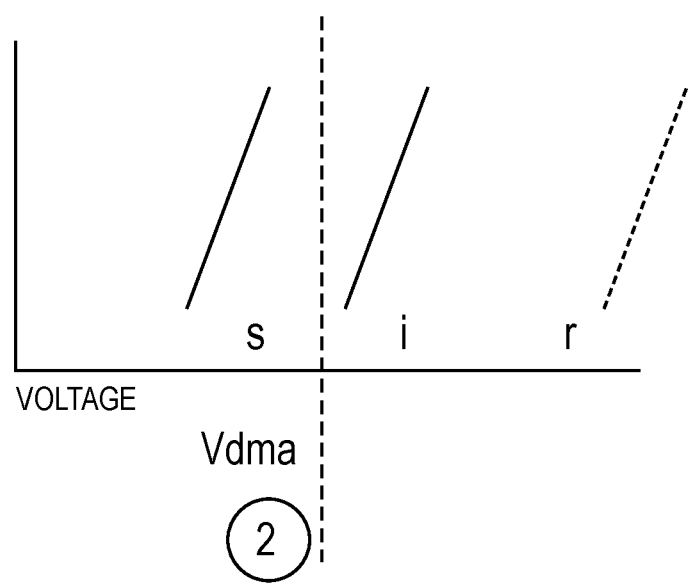

FIGS. 4A and 4B illustrate an example of a read at a higher magnitude voltage followed by a read at a lower magnitude voltage for 1.5 bit MLC memory. FIGS. 4A and 4B illustrate an example for MLC memory with three states (set, intermediate, and reset). However, the same technique can be used for MLC memory with more than three states (e.g., four states, eight states, or another number of states greater than three). Turning to FIG. 4A, a first read (labeled "1") is performed at a higher magnitude voltage. In one example, the first read is performed at a voltage having a magnitude between the expected threshold voltage for the intermediate state and the expected threshold voltage for the reset state. In one example, the voltage applied during the first read is adjusted for drift (e.g., the first read voltage is between Vdm0 (no drift) and Vdm1 (with drift)). The first read between Vdm0 and Vdm1 causes the drift for memory cells in the set or intermediate states to be reset.

Referring to FIG. 4B, after the first read, a read at a lower magnitude voltage is performed. In the illustrated example, a read is performed at a voltage between the expected set threshold voltage and the expected intermediate threshold voltage assuming zero drift. Because the first read is performed at a higher voltage to reset the drift for set and intermediate cells, the drift tracking scheme for MLC memory can be simplified. For example, by resetting drift for set and intermediate cells at the beginning of the read, there is no need to track the time since the last read.

Figure 5:
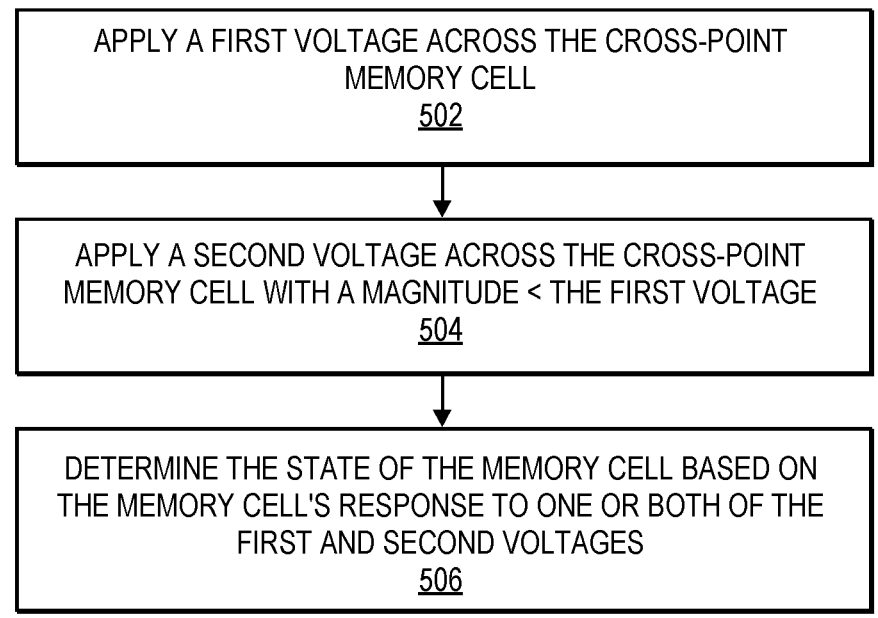
FIGS. 5-7 are flow diagrams illustrating examples of methods of reading cross-point memory.
Figure 6:
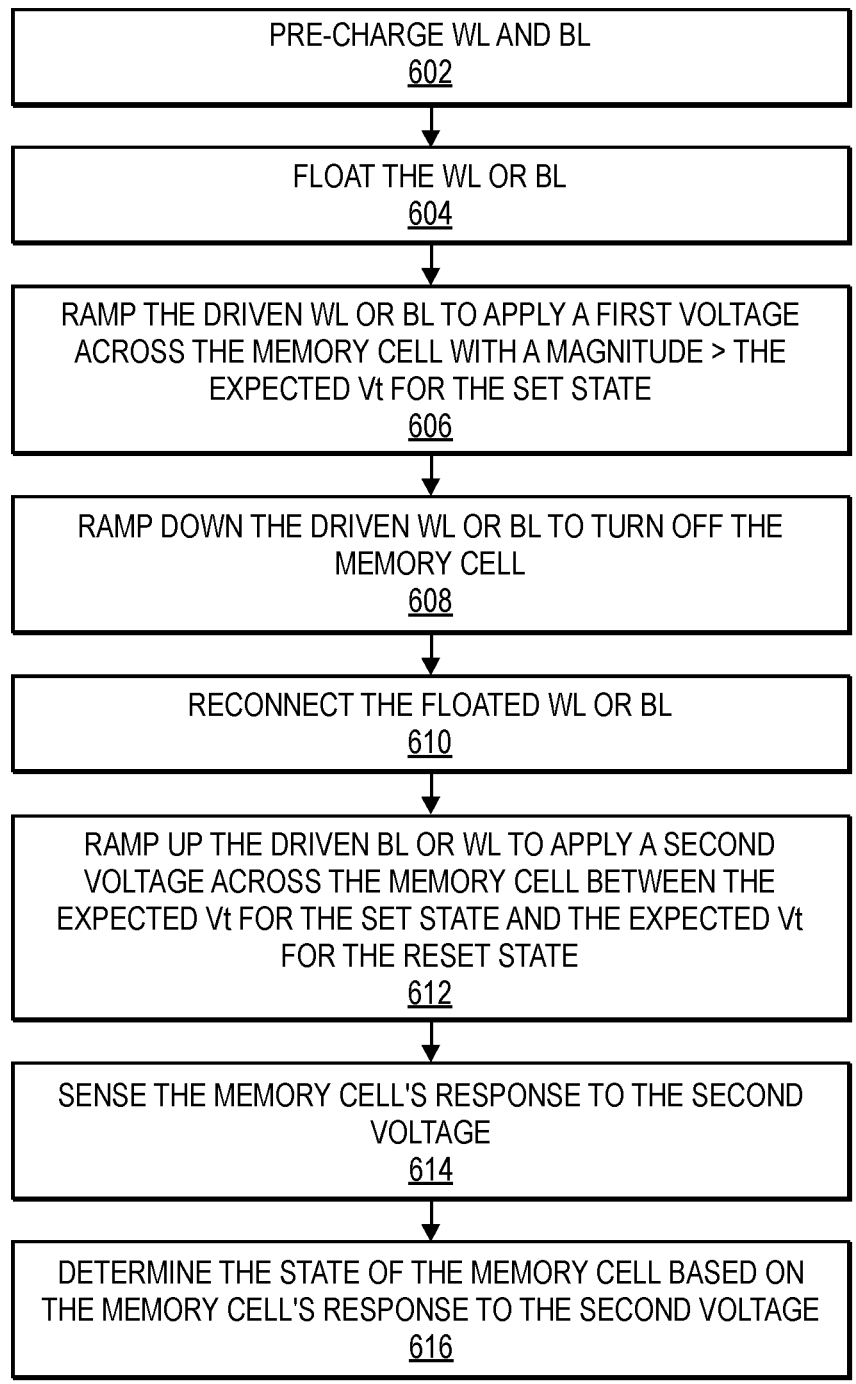
Figure 7:
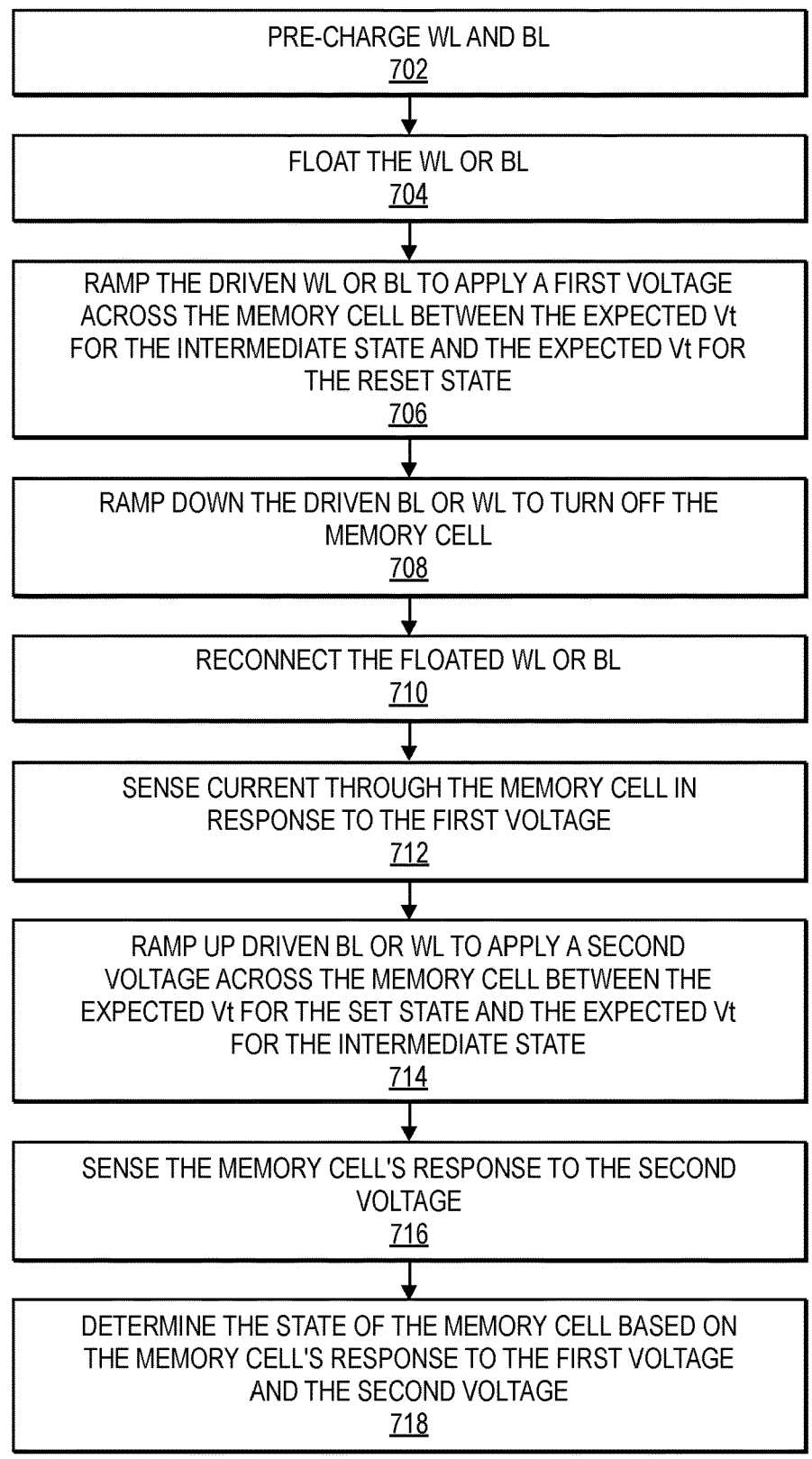

FIGS. 5-7 are flow diagrams illustrating examples of methods of reading cross-point memory. The methods of FIGS. 5-7 can be performed by hardware (e.g., circuitry), firmware, or a combination of hardware and firmware. The hardware and firmware may be located (or in the case of firmware, stored and executed) on the same die as the cross-point memory array, or on a separate die. Referring to FIG. 1, the methods 5-7 may be performed by access circuitry 108 coupled with the cross-point array. FIG. 5 illustrates an example of a method 500 of reading a cross-point memory cell (SLC or MLC). FIG. 6 illustrates an example of a method 600 of reading an SLC cross-point memory cell. FIG. 7 illustrates an example of a method 700 of reading an MLC cross-point memory cell that can programmed to one of three states.

Turning to FIG. 5, the method 500 begins with applying a first read voltage across the cross-point memory cell, at 502. In one example, the conductive access lines (e.g., the wordline (WL) and the bitline (BL)) coupled with the cross-point memory cell are first pre-charged. Pre-charging the wordline and the bitline involves applying a voltage to bring the wordline and bitline to a particular pre-determined voltage level. Applying a voltage across the cross-point memory cell involves causing or generating a voltage between the two terminals of the memory cell. In one example, the read voltage applied across the cell is Vb1−Vw1 (the difference between the bitline voltage and the wordline voltage). Therefore, various combinations of wordline and bitline voltages can be applied to achieve the read voltage across the memory cell.

In one example, the first voltage is applied as a full float read. For example, after pre-charging the conductive access lines, the method may involve floating one of the conductive access lines while driving another of the conductive access lines. For example, the wordline may be floated while a voltage is applied to the bitline, or the bitline may be floated while a voltage is applied to the wordline. In one example, floating a conductive access line involves turning off a select transistor (e.g., a local or global wordline or bitline select transistor) to cause the conductive access line to be decoupled from the surrounding circuitry.

In an example of a full-float read, the driven conductive access line (e.g., the access line that is not floated) is then ramped to cause a first voltage to be applied across the memory cell. In other examples, one of the conductive access lines may not be floated. In one example, the first read voltage is selected based on expected threshold voltage drift of the cross-point memory cell. In one such example, the expected threshold voltage drift is based on time since last write to the cross-point memory cell.

Consider an example of reading an SLC memory cell in which the state of the memory cell is one of two states. In one such example, the first voltage has a magnitude higher than an expected threshold voltage of at least one of the two states (e.g., at least greater than the expected set Vt). For example, referring to FIG. 3A, the driven wordline or bitline is ramped to a voltage to cause the voltage across the memory cell to have a magnitude that is greater than or equal to V_drift_reset. In another example of reading an MLC memory cell, the state of the memory cell is one of at least three states. Three states may include, for example: a first state (e.g., set), a second state (e.g., intermediate) with a threshold voltage distribution higher than the first state, and a third state (e.g., reset) with a threshold voltage distribution higher than the second state. In one such example, the first voltage has a magnitude between expected threshold voltages for the two highest VT states: the second state (e.g., intermediate) and the third state (e.g., reset). For example, referring to FIG. 4A, the driven wordline or bitline is ramped to a voltage to cause a voltage across the memory cell having a magnitude greater than or equal to Vdm0 and less than or equal to Vdm1.

After applying the first voltage, the method involves applying a second voltage across the cross-point memory cell with a magnitude that is less than the first voltage, at 504.

The application of the first higher magnitude voltage causes drift to be reset. Therefore, in one example, the second voltage is selected based on an absence of threshold voltage drift. In an example of reading an SLC memory cell in which the memory cell can be in one of two states, the second voltage has a magnitude between expected threshold voltages for the two states. For example, referring to FIG. 3B, the second voltage is at Vdm0, which is the read voltage when there is no drift. In an example of reading an MLC memory cell where the memory cell can be in one of three states, the second voltage has a magnitude between expected threshold voltages for the two lowest Vt states (e.g., the first state and the second state). For example, referring to FIG. 4B, the second voltage is at Vdma, the read voltage between expected threshold voltages for the set and intermediate states without drift.

Referring again to FIG. 5, the method 500 involves determining the state of the cross-point memory cell based on a response of the cross-point memory cell to at least the second voltage, at 506. Determining the state of the memory cell may involve, for example, sensing an electrical response of the memory cell to the applied voltage. For example, sensing the electrical response may include sensing current through the cell, a voltage across the cell, a voltage in a path to the cell, a change in charge, or any method that a person skilled in the art could use to sense the state of the cell in response to the first voltage, the second voltage, or both the first and second voltages. The sensed response is then compared with a pre-determined threshold to determine if the memory cell has thresholded in response to an applied voltage. For example, considering the SLC example where the memory cell can be in one of two states, the read at the first voltage resets the drift, and the state of the cell is determined based on the memory cell's response to application of the second voltage. In another example, considering the MLC example where the memory cell is in one of three states, determining the state of the cross-point memory cell is based on both a first response of the cross-point memory cell to the first voltage and a second response of the cross-point memory cell to the second voltage.

FIG. 6 is a flow chart of an example of a method 600 of reading an SLC cross-point memory cell that can be in one of two states (e.g., a set state and a reset state, such as illustrated in FIGS. 3A and 3B). The method 600 of FIG. 6 involves pre-charging the conductive wordline and bitline, at 602 and floating either the wordline or the bitline, at 604. The driven conductive access line is ramped up to a first voltage that is greater than the expected Vt for the set state, at 606. In one example, the first voltage causes the cell to threshold and the drift to be reset for memory cells in the set state.

The driven conductive access line is then ramped down to cause the memory cell to turn off, at 608. The floated conductive access line is then reconnected (e.g., by turning on the select transistors for that conductive access line), at 610. The driven conductive access line is then ramped up to apply a lower magnitude second voltage across the memory cell between the expected Vt for the set state and the expected Vt for the reset state, at 612. The memory cell's response to the second voltage is then sensed (e.g., with a sense amplifier), at 614. The state of the memory cell can then be determined based on the memory cell's response to the second voltage, at 616.

FIG. 7 is a flow chart of an example of a method 700 of reading a 1.5 bit MLC cross-point memory cell that can be in one of three states (e.g., a set state, an intermediate state, and a reset state). Like the methods of FIGS. 5 and 6, the method 700 of FIG. 7 involves pre-charging the conductive access lines, at 702, and floating one of the conductive access lines, at 704. The driven conductive access line is ramped up to apply a first voltage across the memory cell between the expected threshold voltage for the intermediate state and the expected threshold for the reset state, at 706. The driven conductive access line is then ramped down to a level to cause the memory cell to turn off, at 708. The data from the first read is sensed to determined cells that are in the reset state. For example, the floated conductive access line is reconnected, at 710. The response of the memory cell to the first voltage can then be sensed, at 712. In one example, if it is determined that the cell is in a reset state (e.g., due to the cell not thresholding in response to the first voltage), the value stored in the memory cell can be determined and the first read can complete. A second read is performed to determine the state (e.g., set or intermediate) of the bits that are not in the reset state.

For example, the driven conductive access line is then ramped to apply a second voltage across the memory cell between the expected threshold voltage for the set state and the expected threshold voltage for the intermediate state, at 714. After applying the second voltage, sensing circuitry senses the memory cell's response to the second voltage, at 716. The state of the memory cell can then be determined based on the memory cell's response to the first voltage and the second voltage, at 718.

Thus, in one example, a first read demarcates the intermediate state from the reset state by applying a Vdm from the last drift tracked write-to-read delay. The first read may be a full-float read that ensures the memory cell's on time is very short. The short read ensures the storage material and select device are minimally disturbed while re-initializing the drift clock. In one example, a second read is performed at the lowest (non-drift tracked) Vdm because the drift clock was re-initialized by the first read. The techniques described in FIG. 7 enables minimizing drift related errors without the need for read drift tracking. Although the examples in FIGS. 6 and 7 refer to the first read being a full float read, in other examples, the first higher magnitude read voltage may be applied without floating the bitline or wordline. Additionally, although FIG. 7 describes an example for a 1.5 bit MLC memory, similar techniques can apply to MLC memory with a higher number of bits per cell (e.g., 2 or more bits).

Figure 8:
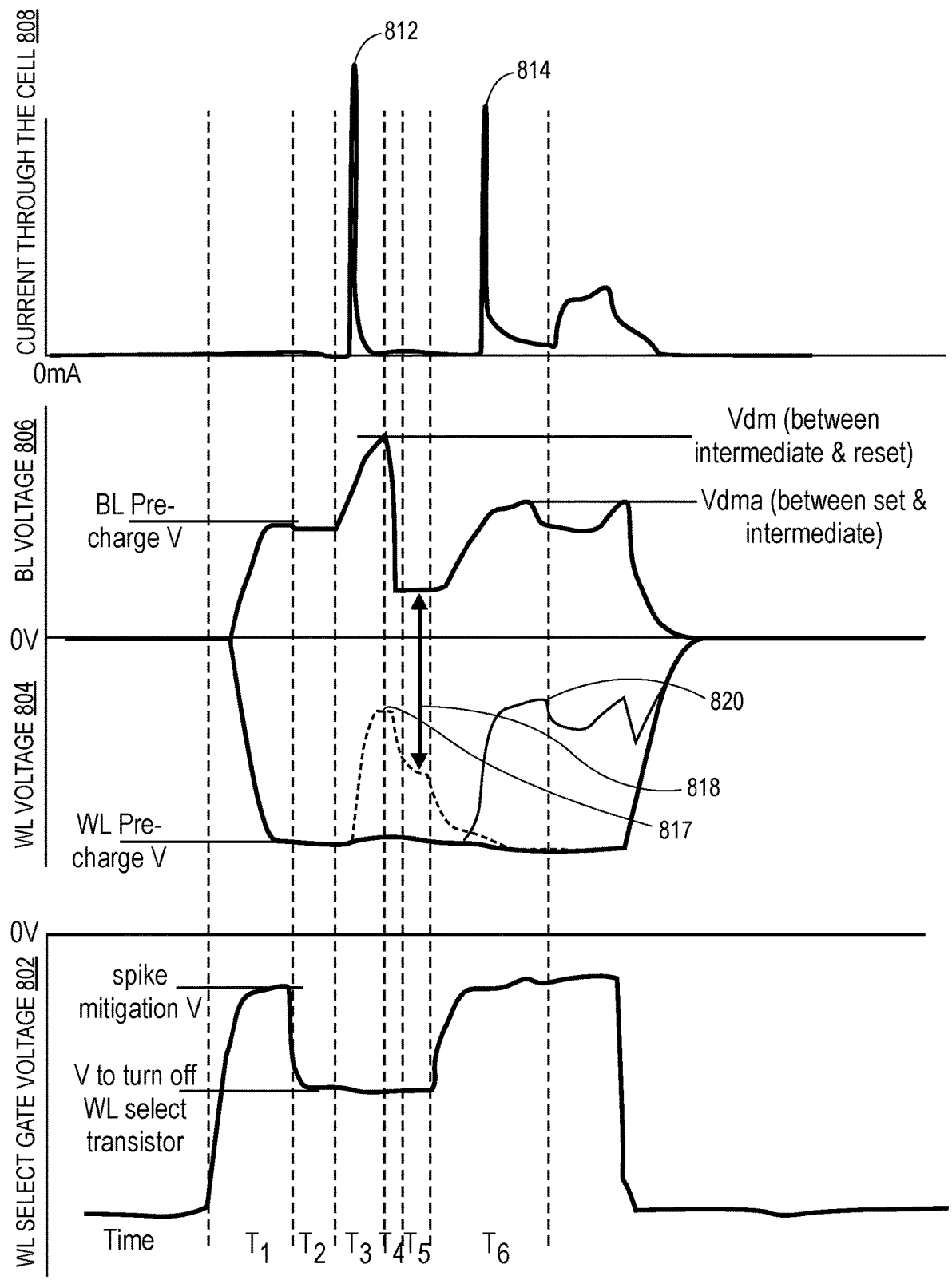
FIG. 8 is an example of a read diagram for an MLC cross-point memory.

FIG. 8 is an example of a read diagram for an MLC cross-point memory. FIG. 8 shows an example of floating the wordline to perform a full float read at a higher voltage followed by a read at a lower voltage. The diagram of FIG. 8 shows the wordline select gate voltage 802, the wordline voltage 804, the bitline voltage 806, and current through the cell 808.

Prior to time T1, the wordline and bitline voltages and cell current are shown as zero, however, they may be at non-zero levels. The wordline select gate voltage is shown as negative prior to T1, however, in other examples, the wordline select gate voltage may be at a different level prior to T1.

During time T1, the wordline and bitline are charged to pre-determined voltage levels. For example, the wordline select gate voltage ramps to a spike mitigation voltage. In the illustrated example, wordline select gate voltage starts negative and is ramped towards ground to the spike mitigation voltage during time T1. In one example, the spike mitigation voltage is selected to mitigate current spikes that may occur due to thresholding of the memory cell. In the illustrated example, the bitline is charged to a positive pre-charge voltage and the wordline is charged to a negative pre-charge voltage. In other implementations, the bitline could be charged to a negative voltage and the wordline could be charged to a positive voltage.

In the example illustrated in FIG. 8, during time T2, the wordline is floated by turning off the wordline select transistor. For example, the wordline select transistor is turned off by applying a more negative voltage to the gate of the select transistor. As can be seen in FIG. 8, a voltage that is negative enough to turn off select transistor is applied the gate of the wordline select transistor. Turning off the wordline select transistor effectively floats the wordline because the wordline is decoupled from circuits other than the memory cell when the wordline select transistor turns off.

During time T3, the bitline is ramped to Vdm between the expected threshold voltages for the intermediate and reset states as adjusted to account for drift. In one example, applying the high magnitude Vdm will cause the memory cell to snap or threshold, as shown by the current spike 812 and the change in wordline voltage 817. For example, if the memory cell is in a lower threshold voltage state, such as an intermediate or set state, the memory cell will threshold in response to the read voltage and the drift will be reset. If the memory cell is in a higher threshold voltage state, such as a reset state, the memory cell may not threshold in response to the read voltage Vdm. Sensing may be performed during the time T3 to determine whether the memory cell thresholded in response to the application of Vdm. The read voltage is applied for a short time in a full float condition (e.g., while the wordline is floated), which minimizes the disturb cause by the read voltage. In one example, the read voltage is applied to the bitline for less than 5 ns. In other examples, the read voltage may be applied for a different duration.

In the illustrated example, the memory cell is quickly turned off during time T4 (a "fast shut down") after application of the higher Vdm, which minimizes disturb to the memory cell. Therefore, the voltage applied to the bitline is ramped down during time T4 to decrease the voltage difference between the wordline and bitline to cause the memory cell to shut off. For example, the bitline is ramped to a voltage with a magnitude that is less than the voltage required to keep the memory cell on (e.g., less than the magnitude of Von). The line 818 shows the decreased voltage difference between the wordline and the bitline. In one example, during time T5, the current through the memory cell in response to Vdm can be sensed (e.g., instead of sensing during time T3).

The full-float read performed between T1-T5 causes set and intermediate cells to threshold, and their corresponding drift to reset. A standard read to demarcate the set state from the intermediate state can then be performed using the lowest undrifted Vdm. During time T6, the bitline voltage is ramped to apply a lower voltage Vdma across the memory cell, where Vdma is between the expected set and intermediate threshold voltages. The voltage Vdma does not need to be shifted to account for drift because the first read reset the drift. In one example, the memory cell may threshold in response to the application of Vdma, as shown by change in wordline voltage 820 and the current spike 814. The memory cell's response to the applied voltage can then be sensed a second time after the time T6. The state of the memory cell can then be determined based on the current through the memory cell in response to the first Vdm and second Vdma. Unlike conventional cross-point memory read schemes, a higher magnitude voltage (Vdm in FIG. 8) read is applied before application of the lower magnitude voltage (Vdma in FIG. 8) second read.

Figure 9:
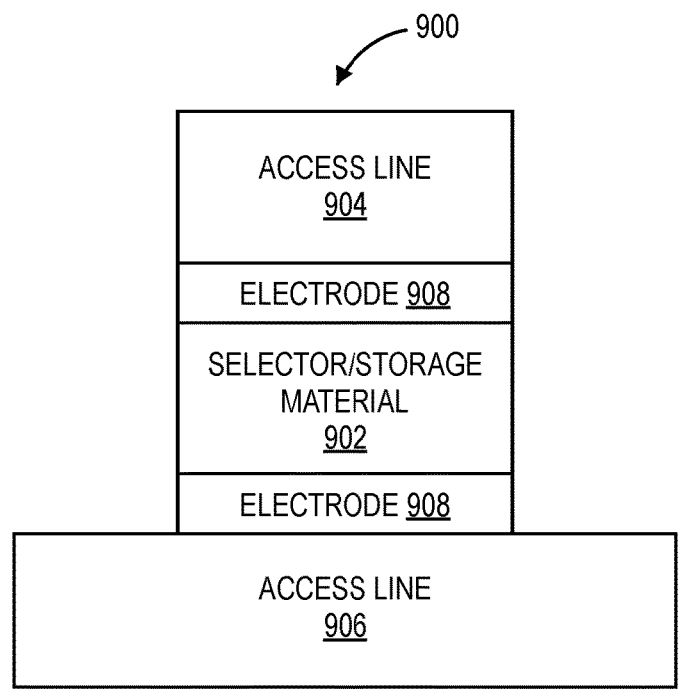
FIG. 9 is an example of a cross-point memory cell.

FIG. 9 illustrates an example of a cross-point memory cell that can be accessed using techniques described herein.

FIG. 9 illustrates a memory cell 900. The memory cell 900 includes one or more layers of material 902 to store data and aid in selection of the memory cell 900. For example, the memory cell 900 can include a storage material 902 (e.g., to form a memory element), a selector material (e.g., to form the switch element), or both, between access lines 904 and 906. In one example, the memory cell includes a layer of storage material and a separate layer of selector material. In one example, both the selector and the storage element have tunable threshold voltages. In one example, the memory cell 900 includes a self-selecting material that exhibits both memory and selection effects. A self-selecting material is a storage material that enables selection of a memory cell in an array without requiring a separate layer of material for selection of the cell. In one example, a self-selecting memory cell includes a single layer of material that acts as both a selector element to select the memory cell and a memory element to store a logic state. A material exhibits memory effects if the material can be put in one of multiple stable states (e.g., via a write operation), and subsequently read back (e.g., via a read operation). In one example, the switch element formed from the select material is an ovonic switch.

The techniques described herein apply generally to cross-point memory and are not dependent on or specific to a particular storage material. However, some non-limiting examples of storage material follow.

In some examples, the storage material is a phase change material. In other examples, the storage material can be in one or multiple stable states without a change in phase. In one example, the memory element, switching element, or both are amorphous semiconductor threshold switches (e.g., ovonic threshold switches) using an amorphous material such as an amorphous chalcogenide material or other amorphous material. An ovonic threshold switch remains in an amorphous state which distinguishes it from an ovonic memory, which generally changes between amorphous and crystalline states. In one example, an ovonic memory is used in series with an ovonic threshold switch. In such case, the ovonic threshold switch operates as the switch element for the ovonic memory. Whether the memory material of the memory cell changes phase or not, in one example, the memory could be referred to as a resistance-based memory. In a resistance-based memory, the bit stored by a memory cell is based on the resistive state of the memory cell.

Examples of storage material can include one or more of: tellurium (Te), selenium (Se), germanium (Ge), antimony (Sb), bismuth (Bi), lead (Pb), tin (Sn), indium (In), silver (Ag), arsenic (As), sulfur (S), phosphorus (P), molybdenum (Mo), gallium (Ga), aluminum (Al), oxygen (O), nitrogen (N), chromium (Cr), gold (Au), niobium (Nb), palladium (Pd), cobalt (Co), vanadium (V), nickel (Ni), platinum (Pt), titanium (Ti), tungsten (W), tantalum (Ta) or other materials. For example, the storage material may include one or more chalcogenide materials such as such as Te—Se, Ge—Te, In—Se, Sb—Te, Ge—Sb, Ta—Sb—Te, Ga—Sb, In—Sb, As—Te, As—Se, Al—Te, As—Se—Te, Ge—Sb—Te, Ge—As—Se, Te—Ge—As, V—Sb—Se, Nb—Sb—Se, In—Sb—Te, In—Se—Te, Te—Sn—Se, V—Sb—Te, Se—Te—Sn, Ge—Se—Ga, Mo—Sb—Se, Cr—Sb—Se, Ta—Sb—Se, Bi—Se—Sb, Mo—Sb—Te, Ge—Bi—Te, W—Sb—Se, Ga—Se—Te, Ge—Te—Se, Cr—Sb—Te, Sn—Sb—Te, W—Sb—Te, Sn—Sb—Bi, In—Sb—Ge, As—Sb—Te, Ge—Te—Ti, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Se—Te—In, As—Ge—Sb—Te, Se—As—Ge—In, Ge—Sb—Se—Te, Ge—Sn—Sb—Te, Ge—Te—Sn—Ni, Ge—Te—Sn—Pd, and Ge—Te—Sn—Pt, Si—Ge—As—Se, In—Sn—Sb—Te, Ge—Se—Te—Si, Si—Te—As—Ge, Ag—In—Sb—Te, Ge—Se—Te—In—Si, Se—As—Ge—Si—In, or other materials capable of being programmed to one of multiple states. One or more elements in a chalcogenide material may be dopants. For example, the storage material may include dopants such as: aluminum (Al), oxygen (O), nitrogen (N), silicon (Si), carbon (C), boron (B), zirconium (Zr), hafnium (Hf), or a combination thereof. The storage material may include other materials or dopants not explicitly listed.

As mentioned above, some memory cells include a separate layer of selector material to form a switch element. The selector material may include a chalcogenide material (e.g., a chalcogenide glass) or other material capable of operating as a selection element. In one example, the selector material includes one or more of: silicon (Si), germanium (Ge), selenium (Se), arsenic (As), tellurium (Te), or other materials. In one example, the selector material includes Si—Ge—As—Se, As—Ge—Te—Si, or other selector material. The selector material may also include dopants such as: aluminum (Al), oxygen (O), nitrogen (N), silicon (Si), carbon (C), boron (B), zirconium (Zr), hafnium (Hf), or a combination thereof. The selector material may include other materials or dopants not explicitly listed.

The access lines 904, 906 electrically couple the memory cell 900 with circuitry that provides power to and enables access to the memory cell 900. The term "coupled" can refer to elements that are physically, electrically, and/or communicatively connected either directly or indirectly, and may be used interchangeably with the term "connected" herein. Physical coupling can include direct contact. Electrical coupling includes an interface or interconnection that allows electrical flow and/or signaling between components. Communicative coupling includes connections, including wired and wireless connections, that enable components to exchange data. The access lines 904, 906 can be referred to as a bit line and word line, respectively. The word line is for accessing a particular word in a memory array and the bit line is for accessing a particular bit in the word. The access lines 904, 906 can be composed of one or more metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicide nitrides including TiSiN and WSiN; conductive metal carbide nitrides including TiCN and WCN, or any other suitable electrically conductive material.

In one example, electrodes 908 are disposed between storage material 902 and access lines 904, 906. Electrodes 908 electrically couple access lines 904, 906 with storage material 902. A memory cell with separate layers of storage and selector material may also include an electrode between the layers of storage and selector material. Electrodes 908 can be composed of one or more conductive and/or semiconductive materials such as, for example: carbon (C), carbon nitride ($C_xN_y$); n-doped polysilicon and p-doped polysilicon; metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; conductive metal oxides including $RuO_2$, or other suitable conductive materials.

Figure 10:
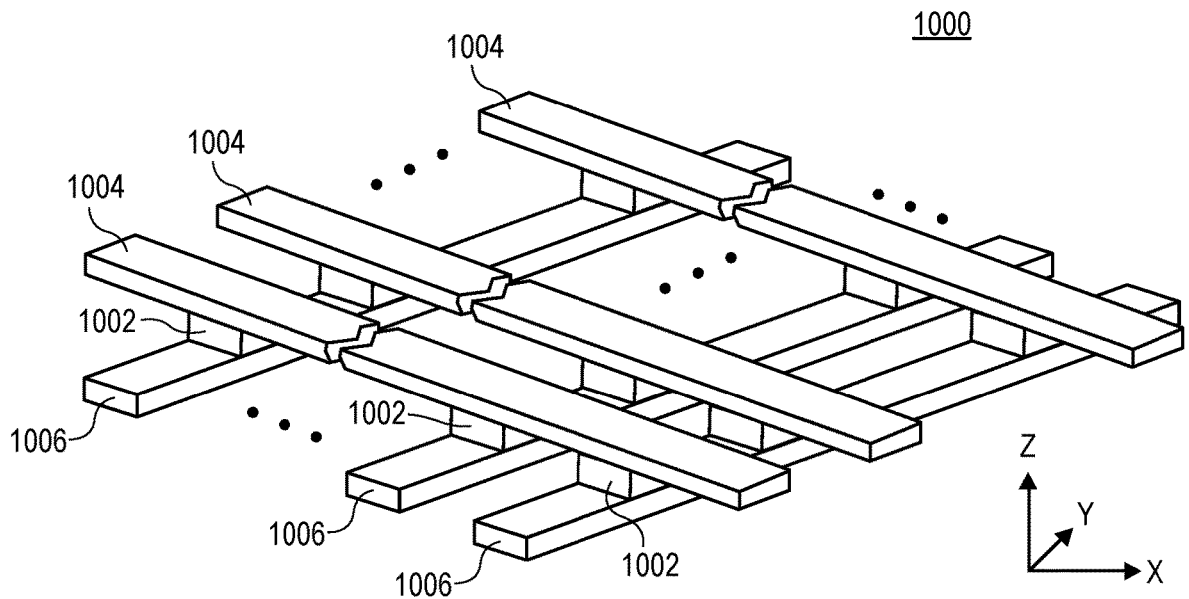
FIG. 10 illustrates an example of a portion of a cross-point memory cell array.

FIG. 10 illustrates a portion of a memory cell array 1000, which can include a memory cell such as the memory cell 106 of FIG. 1 or memory cell 900 of FIG. 9. The memory cell array 1000 is an example of a cross-point memory array. The memory cell array 1000 includes a plurality of access lines 1004, 1006, which can be the same or similar as the access lines 904, 906 described with respect to FIG. 9. Access lines 1004, 1006 can be referred to as bitlines and wordlines. In the example illustrated in FIG. 10, the bitlines (e.g., access lines 1004) are orthogonal to the wordlines (e.g., access lines 1006). A storage material 1002 is disposed between the access lines 1004, 1006. In one example, a "cross-point" is formed at an intersection between a bitline and a wordline. A memory cell is created from the storage material 1002 between the bitline and wordline where the bitline and wordline intersect. The storage material 1002 can be a chalcogenide material, phase change material, both a chalcogenide material and phase change material, or other storage material. In one example, the access lines 1004, 1006 are composed of one or more conductive materials such as the access lines 904, 906 described above with respect to FIG. 9.

Although a single level or tier of memory cells is shown in FIG. 10 for the sake of clarity, memory cell array 1000 typically includes multiple levels or tiers of non-volatile memory cells (e.g., in the z-direction). Nonvolatile memory devices including multiple tiers of cross-point memory cells may be referred to as three-dimensional (3D), multi-level, or multi-tiered cross-point memory devices. The FIGS. 9 and 10 illustrate an example of a memory cell and array in which the read techniques described herein may be implemented. However, the techniques described herein can be implemented in memory cell structures and arrays having different materials or structures than the examples described in FIGS. 9 and 10.

Figure 11:
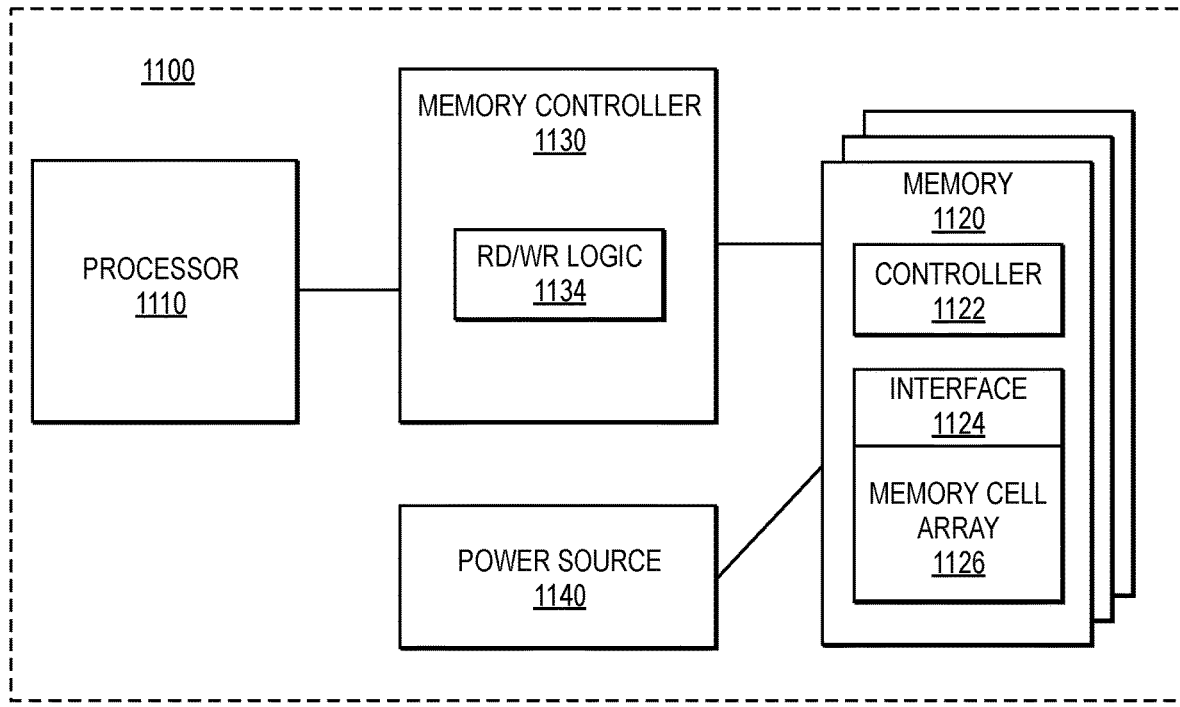
FIG. 11 is a block diagram of a system that can include a non-volatile memory device that implements access techniques described herein.

FIG. 11 is a block diagram of a system that can include a non-volatile memory device in accordance with examples described herein.

System 1100 includes components of a memory subsystem having cross-point memory 1120 to store and provide data in response to operations of processor 1110. The system 1100 receives memory access requests from a host or a processor 1110, which is processing logic that executes operations based on data stored in cross-point memory 1120 or generates data to store in cross-point memory 1120. The processor 1110 can be or include a host processor, central processing unit (CPU), microcontroller or microprocessor, graphics processor, peripheral processor, application specific processor, or other processor, and can be single core or multicore.

The system 1100 includes a memory controller 1130 (e.g., host memory controller), which represents logic to interface with cross-point memory 1120 and manage access to data stored in the memory. In one example, the memory controller 1130 is integrated into the hardware of processor 1110. In one example, the memory controller 1130 is standalone hardware, separate from the processor 1110. The memory controller 1130 can be a separate circuit on a substrate that includes the processor. The memory controller 1130 can be a separate die or chip integrated on a common substrate with a processor die (e.g., as a system on a chip (SoC)). In one example, the memory controller 1130 is an integrated memory controller (iMC) integrated as a circuit on the processor die. In one example, at least some of cross-point memory 1120 can be included on an SoC with the memory controller 1130 and/or the processor 1110.

In the illustrated example, the memory controller 1130 includes read/write logic 1134, which includes hardware to interface with the cross-point memory 1120. The logic 1134 enables the memory controller 1130 to generate read and write commands to service requests for data access generated by the execution of instructions by processor 1110.

The memory resources or cachelines in the cross-point memory 1120 are represented by a memory cell array 1126, which can include a cross-point array. The cross-point memory 1120 includes an interface 1124 (e.g., interface logic) to control the access to the memory device array 1126. The interface 1124 can include decode logic, including logic to address specific rows or columns, bit lines or word lines, or otherwise address specific bits of data. The controller 1122 represents an on-die (e.g., on the same die as the memory array) or on-package (e.g., in the same package as the memory array) controller on cross-point memory 1120 to control its internal operations to execute commands received from memory controller 1130. For example, the controller 1122 can control any of timing, voltage levels, addressing, I/O (input/output) margining, scheduling, and error correction for cross-point memory 1120.

In one example, the controller 1122 is configured to read and write to the memory device array 1126 in accordance with any example described herein. A power source 1140 is connected to the cross-point memory 1120 to provide one or more voltage rails for operation of the cross-point memory 1120.

Figure 12:
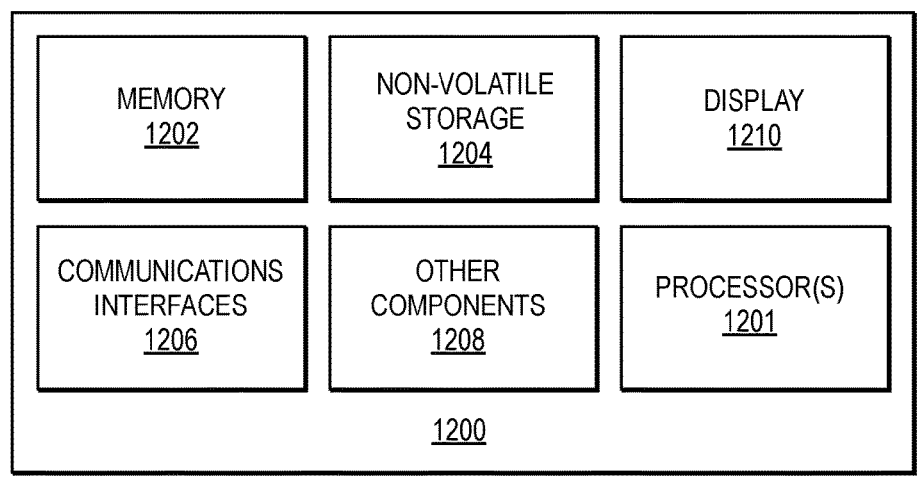
FIG. 12 provides an exemplary depiction of a computing system that can include a non-volatile memory device that implements access techniques described herein.

FIG. 12 provides an exemplary depiction of a computing system 1200 (e.g., a smartphone, a tablet computer, a laptop computer, a desktop computer, a server computer, etc.). As observed in FIG. 12, the system 1200 may include one or more processors or processing units 1201. The processor(s) 1201 may include one or more central processing units (CPUs), each of which may include, e.g., a plurality of general-purpose processing cores. The processor(s) 1201 may also or alternatively include one or more graphics processing units (GPUs) or other processing units. The processor(s) 1201 may include memory management logic (e.g., a memory controller) and I/O control logic. The processor(s) 1201 can be similar to, or the same as, the processor 1110 of FIG. 11.

The system 1200 also includes memory 1202 (e.g., system memory), non-volatile storage 1204, communications interfaces 1206, a display 1210 (e.g., touchscreen, flat-panel), and other components 1208. The other components may include, for example, a power supply (e.g., a battery or/and other power supply), sensors, power management logic, or other components. The communications interfaces 1206 may include logic and/or features to support a communication interface. For these examples, communications interface 1206 may include one or more communication interfaces that operate according to various communication protocols or standards to communicate over direct or network communication links or channels. Direct communications may occur via use of communication protocols or standards described in one or more industry standards (including progenies and variants) such as those associated with the PCIe specification. Network communications may occur via use of communication protocols or standards such those described in one or more Ethernet standards promulgated by IEEE. For example, one such Ethernet standard may include IEEE 802.3. Network communication may also occur according to one or more OpenFlow specifications such as the OpenFlow Switch Specification. Other examples of communications interfaces include, for example, a local wired point-to-point link (e.g., USB) interface, a wireless local area network (e.g., WiFi) interface, a wireless point-to-point link (e.g., Bluetooth) interface, a Global Positioning System interface, and/or other interfaces.

The computing system also includes non-volatile storage 1204, which may be the mass storage component of the system. The non-volatile storage 1204 can be similar to, or the same as, the cross-point memory 1120 of FIG. 11, described above. A non-volatile memory (NVM) device is a type of memory whose state is determinate even if power is interrupted to the device. In one embodiment, the NVM device may include block or byte-addressable, write-in-place memories. Examples may include, but are not limited to, single or multi-level Phase Change Memory (PCM) or phase change memory with a switch (PCMS), non-volatile types of memory that include chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other types of block or byte-addressable, write-in-place memory. In one example, the non-volatile storage 1204 may include mass storage that is composed of one or more SSDs (solid state drives), DIMMs (dual in line memory modules), or other module or drive. The non-volatile storage 1204 may implement techniques in accordance with examples described herein.

Examples of devices, systems, and methods to perform read techniques follow.

Example 1: A memory device including an array of cross-point memory cells, each of the cross-point memory cells including a memory element and a switch element, and circuitry to: apply a first voltage across the cross-point memory cell, after application of the first voltage across the cross-point memory cell, apply a second voltage across the cross-point memory cell, the second voltage having a magnitude that is lower than the first voltage, and determine a state of the cross-point memory cell based on a response of the cross-point memory cell to at least the second voltage.

Example 2: The memory device of example 1, wherein the second voltage is selected based on an absence of threshold voltage drift of the cross-point memory cell.

Example 3: The memory device of any of examples 1 or 2, wherein the first voltage is selected based on expected threshold voltage drift of the cross-point memory cell.

Example 4: The memory device of any of examples 1-3, wherein the expected threshold voltage drift is based on time since last write to the cross-point memory cell.

Example 5: The memory device of any of examples 1-4, wherein the state of the memory cell is one of two states, and the first voltage has a magnitude higher than an expected threshold voltage of at least one of the two states.

Example 6: The memory device of any of examples 1-5, wherein: the second voltage has a magnitude between expected threshold voltages for the two states.

Example 7: The memory device of any of examples 1-4, wherein the state of the memory cell is one of at least three states, including a first state, a second state with a threshold voltage distribution higher than the first state, and a third state with a threshold voltage distribution higher than the second state, and the first voltage has a magnitude between expected threshold voltages for the second state and the third state.

Example 8: The memory device of any of examples 1-7, wherein the second voltage has a magnitude between expected threshold voltages for the first state and the second state.

Example 9: The memory device of any of examples 1-8, wherein a determination of the state of the cross-point memory cell is based on both a first response of the cross-point memory cell to the first voltage and a second response of the cross-point memory cell to the second voltage.

Example 10: The memory device of any of examples 1-9, wherein the circuitry to apply the first voltage is to: ramp up a first conductive access line coupled with the cross-point memory cell to apply the first voltage while a second conductive access line is floated.

Example 11: The memory device of any of examples 1-10, wherein the circuitry is to: pre-charge the first and second conductive access lines coupled with the cross-point memory cell, float the second conductive access line, ramp up the first conductive access line to apply the first voltage, ramp down the first conductive access line to turn off the cross-point memory cell, and ramp up the first conductive access line to apply the second voltage.

Example 12: The memory device of any of examples 1-11, wherein, the circuitry to float the second conductive access line is to: turn off a select transistor for the second conductive access line.

Example 13: The memory device of any of examples 1-12, wherein: the circuitry is to: after the ramp down of the first conductive access line to turn off the cross-point memory cell, connect the second conductive access line to a sense amplifier, sense a first current or voltage in response to the first voltage, and after the ramp up the first conductive access line to apply the second voltage, sense a second current or voltage in response to the second voltage.

Example 14: A method of reading a cross-point memory cell, the method including applying a first voltage across the cross-point memory cell, after applying the first voltage across the cross-point memory cell, applying a second voltage across the cross-point memory cell, the second voltage having a magnitude that is lower than the first voltage, and determining a state of the cross-point memory cell based on a response of the cross-point memory cell to at least the second voltage.

Example 15: The method of example 14, wherein the second voltage is selected based on an absence of threshold voltage drift of the cross-point memory cell.

Example 16: The method of any of examples 14-15, wherein the first voltage is selected based on expected threshold voltage drift of the cross-point memory cell.

Example 17: The method of any of examples 14-16, wherein the expected threshold voltage drift is based on time since last write to the cross-point memory cell.

Example 18: The method of any of examples 14-17, wherein the state of the memory cell is one of two states, and the first voltage has a magnitude higher than an expected threshold voltage of at least one of the two states.

Example 19: A system including a memory controller, and a memory die in a same package as the memory controller, the memory die including an array of cross-point memory cells, each of the cross-point memory cells including a memory element and a switch element; and circuitry to: apply a first voltage across the cross-point memory cell, after application of the first voltage across the cross-point memory cell, apply a second voltage having a magnitude that is lower than the first voltage, and determine a state of the cross-point memory cell based on a response of the cross-point memory cell to at least the second voltage Example 20: The system of example 19, further including one or more of: a processor, a host memory controller, a display, and a power source.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

The hardware design embodiments discussed above may be embodied within a semiconductor chip and/or as a description of a circuit design for eventual targeting toward a semiconductor manufacturing process. In the case of the later, such circuit descriptions may take of the form of a (e.g., VHDL or Verilog) register transfer level (RTL) circuit description, a gate level circuit description, a transistor level circuit description or mask description or various combinations thereof. Circuit descriptions are typically embodied on a computer readable storage medium (such as a CD-ROM or other type of storage technology).

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory device comprising:
an array of cross-point memory cells, each of the cross-point memory cells including a memory element and a switch element; and
circuitry to:
apply a first voltage across the cross-point memory cell, wherein the first voltage has a first magnitude;
after application of the first voltage across the cross-point memory cell, apply a second voltage across the cross-point memory cell, wherein the second voltage has a second magnitude that is lower than the first magnitude; and
determine a state of the cross-point memory cell based on a response of the cross-point memory cell to at least the second voltage, wherein:
the state of the cross-point memory cell is one of at least three states, including a first state, a second state with a first threshold voltage distribution higher than the first state, and a third state with a second threshold voltage distribution higher than the second state, and
the first magnitude is between expected threshold voltages for the second state and the third state.

2. The memory device of claim 1, wherein:
the second voltage is selected based on an absence of threshold voltage drift of the cross-point memory cell.

3. The memory device of claim 2, wherein:
the first voltage is selected based on expected threshold voltage drift of the cross-point memory cell.

4. The memory device of claim 3, wherein:
the expected threshold voltage drift is based on time since last write to the cross-point memory cell.

5. The memory device of claim 1, wherein:
the expected threshold voltages are first expected threshold voltages, and
the second magnitude is between second expected threshold voltages for the first state and the second state.

6. The memory device of claim 1, wherein:
a determination of the state of the cross-point memory cell is based on both the response of the cross-point memory cell to the second voltage and a further response of the cross-point memory cell to the first voltage.

7. The memory device of claim 1, wherein:
the circuitry to apply the first voltage is to: ramp up a first conductive access line coupled with the cross-point memory cell to apply the first voltage while a second conductive access line is floated.

8. The memory device of claim 7, wherein:
the circuitry is to:
pre-charge the first and second conductive access lines coupled with the cross-point memory cell;
float the second conductive access line;
ramp up the first conductive access line to apply the first voltage;
ramp down the first conductive access line to turn off the cross-point memory cell; and
ramp up the first conductive access line to apply the second voltage.

9. The memory device of claim 8, wherein:
the circuitry to float the second conductive access line is to: turn off a select transistor for the second conductive access line.

10. The memory device of claim 8, wherein:
the circuitry is to:
after the ramp down of the first conductive access line to turn off the cross-point memory cell, connect the second conductive access line to a sense amplifier;
sense a first current, voltage, or change in charge in response to the first voltage; and
after the ramp up the first conductive access line to apply the second voltage, sense a second current, voltage, or change in charge in response to the second voltage.

11. A method of reading a cross-point memory cell, the method comprising:
applying a first voltage across the cross-point memory cell, wherein the first voltage has a first magnitude;
after applying the first voltage across the cross-point memory cell, applying a second voltage across the cross-point memory cell, wherein the second voltage has a second magnitude that is lower than the first magnitude; and
determining a state of the cross-point memory cell based on a response of the cross-point memory cell to at least the second voltage, wherein:
the state of the cross-point memory cell is one of at least three states, including a first state, a second state with a first threshold voltage distribution higher than the first state, and a third state with a second threshold voltage distribution higher than the second state, and
the first magnitude is between expected threshold voltages for the second state and the third state.

12. The method of claim 11, wherein:
the second voltage is selected based on an absence of threshold voltage drift of the cross-point memory cell.

13. The method of claim 12, wherein:
the first voltage is selected based on expected threshold voltage drift of the cross-point memory cell.

14. The method of claim 13, wherein:
the expected threshold voltage drift is based on time since last write to the cross-point memory cell.

15. A system comprising:
a memory controller; and
a memory die in a same package as the memory controller, the memory die comprising:
an array of cross-point memory cells, each of the cross-point memory cells including a memory element and a switch element; and
circuitry to:
apply a first voltage across the cross-point memory cell, wherein the first voltage has a first magnitude;
after application of the first voltage across the cross-point memory cell, apply a second voltage across the cross-point memory cell, wherein the second voltage has a second magnitude that is lower than the first magnitude; and
determine a state of the cross-point memory cell based on a response of the cross-point memory cell to at least the second voltage, wherein:
the state of the cross-point memory cell is one of at least three states, including a first state, a second state with a first threshold voltage distribution higher than the first state, and a third state with a second threshold voltage distribution higher than the second state, and
the first magnitude is between expected threshold voltages for the second state and the third state.

16. The system of claim 15, further comprising:
one or more of: a processor, a host memory controller, a display, and a power source.

17. The system of claim 15, wherein:
the expected threshold voltages are first expected threshold voltages, and
the second magnitude is between second expected threshold voltages for the first state and the second state.

18. The system of claim 15, wherein:
a determination of the state of the cross-point memory cell is based on both the response of the cross-point memory cell to the second voltage and a further response of the cross-point memory cell to the first voltage.

19. The system of claim 15, wherein:
the circuitry to apply the first voltage is to: ramp up a first conductive access line coupled with the cross-point memory cell to apply the first voltage while a second conductive access line is floated.

20. The system of claim 19, wherein:
the circuitry is to:
pre-charge the first and second conductive access lines coupled with the cross-point memory cell,
float the second conductive access line,
ramp up the first conductive access line to apply the first voltage,
ramp down the first conductive access line to turn off the cross-point memory cell, and
ramp up the first conductive access line to apply the second voltage.

* * * * *